United States Patent [19]

Sato

[11] Patent Number: 5,789,947
[45] Date of Patent: Aug. 4, 1998

[54] PHASE COMPARATOR

[75] Inventor: Masatoshi Sato, Tochigi-ken, Japan

[73] Assignee: Nippon Precision Circuits Inc., Tokyo, Japan

[21] Appl. No.: 716,078

[22] Filed: Sep. 19, 1996

[30]   Foreign Application Priority Data

Sep. 21, 1995  [JP]  Japan ................... 7-243239

[51] Int. Cl.[6] .................................................. H03D 13/00
[52] U.S. Cl. ...................... 327/3; 327/2; 327/7; 327/12; 324/76.82
[58] Field of Search ............................... 327/2, 7, 3, 12; 324/76.52, 76.77, 76.78, 76.82

[56]   References Cited

U.S. PATENT DOCUMENTS

| | | | |
|---|---|---|---|
| 3,600,690 | 8/1971 | White | 324/76.82 |
| 3,646,455 | 2/1972 | Coccagna | 324/76.82 |
| 3,701,013 | 10/1972 | Gilmore | 324/76.82 |
| 4,128,812 | 12/1978 | Pavlis | 324/76.82 |
| 4,333,055 | 6/1982 | Crackel | 328/133 |
| 4,959,617 | 9/1990 | Martin | 328/133 |
| 5,142,555 | 8/1992 | Whiteside | 375/81 |
| 5,539,345 | 7/1996 | Hawkins | 327/150 |

*Primary Examiner*—Timothy P. Callahan
*Assistant Examiner*—An T. Luu
*Attorney, Agent, or Firm*—Jordan & Hamburg

[57]   ABSTRACT

A phase comparator has a first comparing circuit and a second comparing circuit. The first comparing circuit produces a first output pulse having a duration equal to a phase lead of a first input signal with respect to a phase of a second input signal. The first phase comparator also produces a second output pulse equal in duration to a phase lag of the first input signal with respect to the phase of the second input signal. The second comparing circuit produces a third pulse equal in duration to a phase lead of a third input signal with respect to a phase of a fourth input signal. The second comparator also produces a fourth output pulse equal in duration to a phase lag of the third input signal with respect to the phase of the fourth input signal. The phase comparator further includes a first combining circuit for combining the first output pulse with the third output pulse, a second combining circuit for combining the second output pulse with the fourth output pulse, and a first delay circuit for relatively delaying the first input signal with respect to the third input signal. Optionally, a second delay circuit delays the fourth input signal relative to the second input signal.

11 Claims, 6 Drawing Sheets

PHASE COMPARATOR

BACKGROUND OF THE INVENTION

The present invention relates to a phase comparator and, more particularly, to a phase comparator employing delays to eliminate insensible periods of operation. The present invention is applicable to use in phase locked loops (PLLs) and other electronic apparatus requiring phase comparison.

Figure 5:
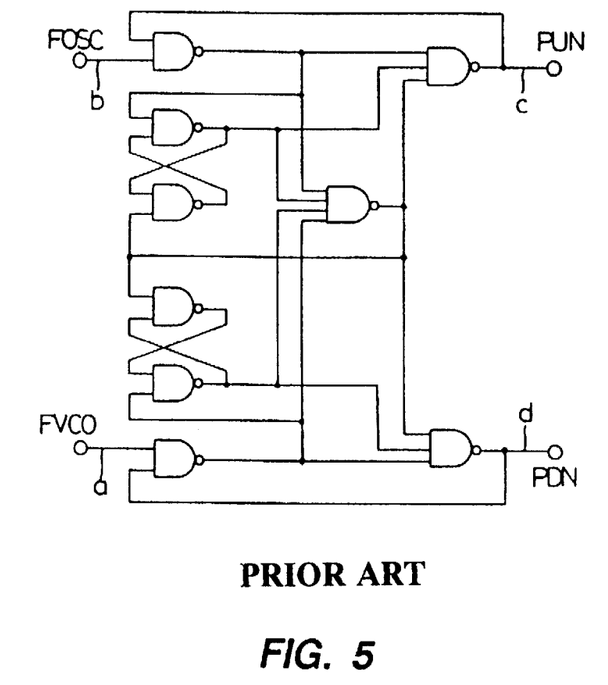
FIG. 5 is an electric circuit schematic of a phase comparator of the prior art.
Figure 6:
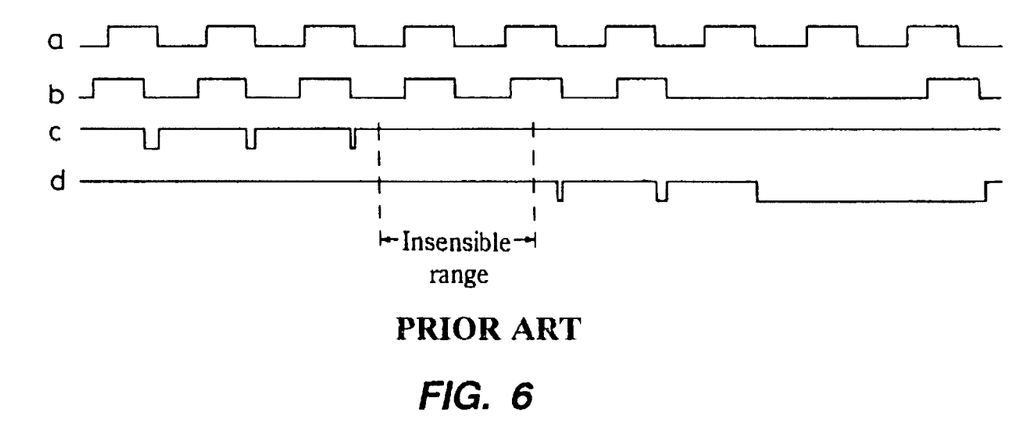
FIG. 6 is a timing chart for the phase comparator of FIG. 5.

In FIG. 5, there is shown a phase comparator which is been widely employed in PLLs and FIG. 6 is a timing chart for the phase comparator of FIG. 5. An input signal "b" is inputted into a terminal FOSC and another input signal "a" is entered into another terminal FVCO. In the phase comparator, the phase of the signal "a" is compared with the phase of the signal "b". When the phase of the signal "a" is delayed from the phase of the signal "b", an output pulse "c" corresponding to this phase difference is outputted to a terminal PUN, whereas when the phase of the signal "a" precedes from the phase of the signal "b", another output pulse "d" corresponding to this phase difference is outputted to a terminal PDN. The terminals PUN and PDN are connected to a charge pump.

In the above-described conventional phase comparator, when the phase of the signal "a" is nearly in-phase with the phase of the signal "b", the comparison operation is not carried out, so that, as indicated in FIG. 6, an insensible range exists where no output pulse in will appear. When such an insensible range exists, there is a problem that a jitter component is increased while the PLL is locked.

SUMMARY OF THE INVENTION

An object of the present invention is to provide a phase comparator in which no insensible range appears even when phases of input signals are nearly in-phase with each other.

Briefly stated, the present invention provides a phase comparator having a first comparing circuit and a second comparing circuit. The first comparing circuit produces a first output pulse having a duration equal to a phase lead of a first input signal with respect to a phase of a second input signal. The first phase comparator also produces a second output pulse equal in duration to a phase lag of the first input signal with respect to the phase of the second input signal. The second comparing circuit produces a third pulse equal in duration to a phase lead of a third input signal with respect to a phase of a fourth input signal. The second comparator also produces a fourth output pulse equal in duration to a phase lag of the third input signal with respect to the phase of the fourth input signal. The phase comparator further includes a first combining circuit for combining the first output pulse with the third output pulse, a second combining circuit for combining the second output pulse with the fourth output pulse, and a first delay circuit for relatively delaying the first input signal with respect to the third input signal.

According to a feature of the invention, there is alternatively provided a second delay circuit for relatively delaying the fourth input signal with respect to the second input signal in place of the above-described first delay circuit.

Alternatively, the present invention further a phase comparator as described above wherein both the first delay circuit and the second delay circuit are employed.

Furthermore, in the above-described respective circuit arrangements, a third delay circuit may be employed which relatively delays one output with respect to the other output among the outputs from the first combining circuit and the second combining circuit.

The above, and other objects, features and advantages of the present invention will become apparent from the following description read in conjunction with the accompanying drawings, in which like reference numerals designate the same elements.

DETAILED DESCRIPTION OF THE INVENTION

The present invention is described in relation to its application to a phase locked loop which is exemplary. Application of the present invention to other uses is considered to be within the scope and spirit of the present invention. It should be understood that the following description is made of such a case that a PLL is constituted by employing the phase comparator shown in FIG. 1.

Figure 1:
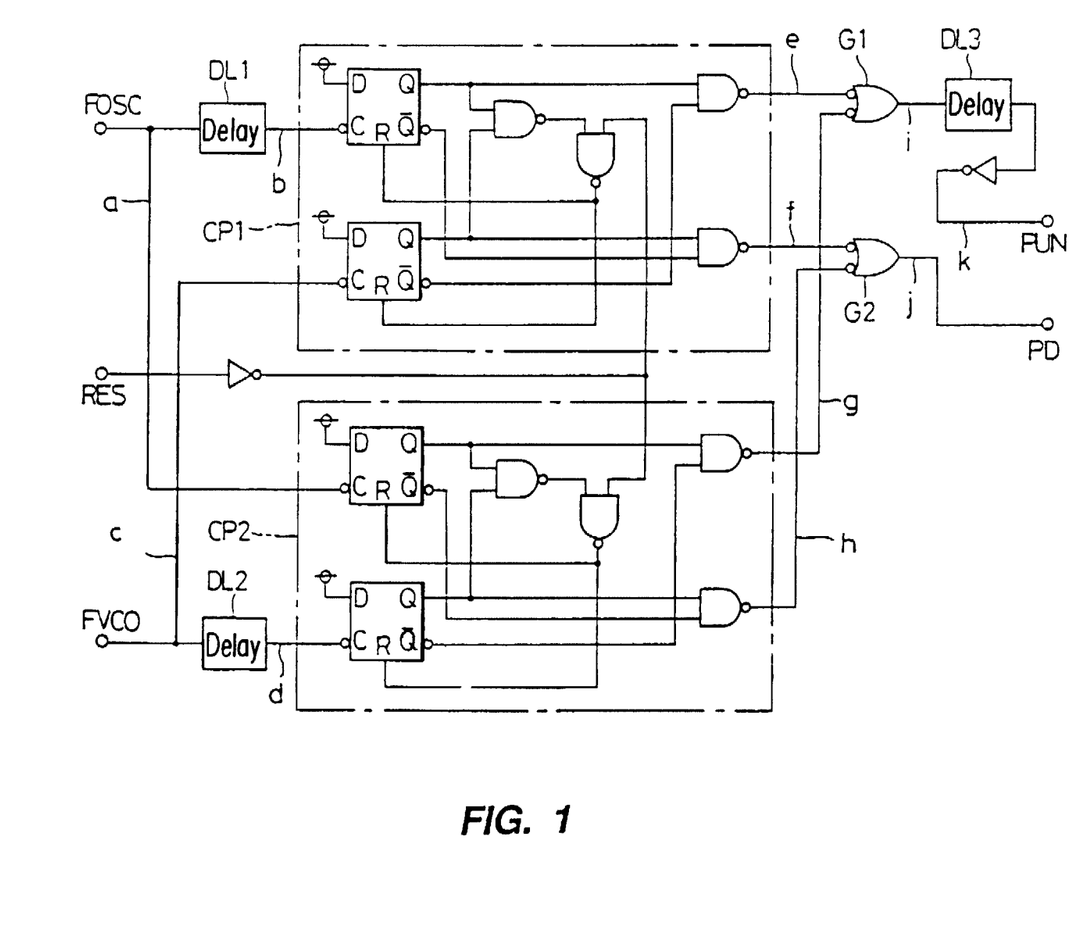
FIG. 1 is an electric circuit schematic of a phase comparator according to a first embodiment of the present invention.

A comparing circuit CP1 produces an output pulse "e" when a phase of an input signal "b" for one D type flip-flop leads a phase of an input signal "c" for the other D type flip-flop, and this output pulse "e" corresponds to the phase lead in duration. The comparing circuit CP1 produces another output pulse "f" when the phase of the signal "b", for one D type flip-flop, the phase of the signal "c" for the other D type flip-flop. The output pulse "f" corresponds to the phase lag in duration.

A comparing circuit CP2 produces an output pulse "g" when a phase of an input signal "a" for one D type flip-flop leads from a phase of an input signal "d" for the other D type flip-flop. The duration of the output pulse "g" corresponds to the phase lead in duration. The comparing circuit CP2 also produces another output pulse "h" when the phase of the signal "a" for one D type flip-flop the phase of the signal "d" for the other D type flip-flop. The duration of the output pulse "h" corresponds to the phase lag in duration.

The configuration of the comparing circuits CP1 and CP2 are completely identical to each other. Independently, considering input/output relationships for the respective comparing circuits CP1 and CP2, these relationships are essentially similar to those of a general-purpose phase comparator (for example, conventional phase comparator shown in FIG. 5). The input/output relationships are defined by a relationship between the input signals "b", "c" and the output pulses "e", "f" in the comparing circuit CP1, and another relationship between the input signals "a", "d" and the output pulses "g" and "h" in the comparing circuit CP2. In other words, the circuit arrangements of the comparing circuits CP1 and CP2 indicated in FIG. 1 are merely examples, and these comparing circuits CP1 and CP2 may be replaced by any other comparing circuits representative of the above-described input/output relationships.

A delay circuit DL1 delays the signal "a", which is generally a reference signal derived from an oscillator and inputted into the input terminal FOSC, for a predetermined time. Considering another view of this function, the delay circuit DL1 delays the input signal "a" supplied to one D type flip-flop of the comparing circuit CP2 for a predetermined time to thereby produce the input signal "b" supplied to one D type flip-flop of the comparing circuit CP1. The delay circuit DL2 delays the input signal "c" supplied to the other D type flip-flop of the comparing circuit CP1 for a predetermined time to thereby produce the input signal "d" supplied to the other D type flip-flop of the comparing circuit CP2. It should be noted in this case that the respective delay times in the delay circuits DL1 and DL2 are equal to each other.

An OR gate G1 combines one output pulse "e" of the comparing circuit CP1 with one output pulse "g" of the comparing circuit CP2, whereas another OR gate G2 combines the other output pulse "f" of the comparing circuit CP1 with the other output pulse "h" of the comparing circuit CP2. After an output "i" of the OR gate G1 has been delayed by a predetermined time in the delay circuit DL3, the delayed output is inverted by an inverter and the inverted output is supplied to an output terminal PUN. An output "j" of the OR gate G2 is directly sent to an output terminal PD. A signal "k" derived from the output terminal PUN is connected as an "up signal", and a signal "j" derived from the output terminal PD is connected as a "down signal" to the charge pump. The delay circuit DL3 is employed is to avoid such a risk that when the output "i" of the OR gate G1 and the output "j" of the OR gate G2 are directly connected to the charge pump, the up control and the down control function are performed in the charge pump at the same time.

A reset terminal RES is used to enter a reset signal for resetting the D type flip-flops employed in the comparing circuits CP1 and CP2.

Figure 2:
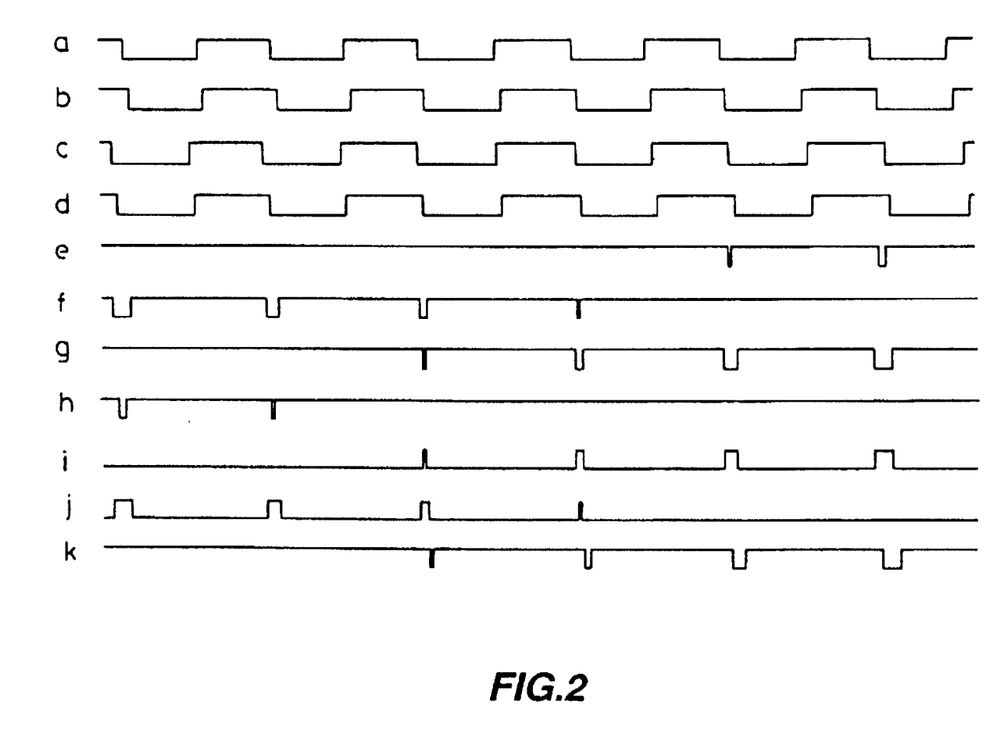
FIG. 2 is a timing chart for the first embodiment of the present invention shown in FIG. 1.

Referring now to the timing chart shown in FIG. 2, operations of the chase comparator indicated in FIG. 1 are explained. The signal "a" representative of the reference signal is inputted from the oscillator to the input terminal FOSC. The signal "a" is directly inputted to one D type flip-flop of the comparing circuit CP2. Also the signal "b" produced by delaying the signal "a" by a predetermined time in the delay circuit DL1 is inputted into one D type flip-flop of the comparing circuit CP1. The signal "c" is inputted from the oscillator to the input terminal FVCO. The signal "c" is directly inputted to the other D type flip-flop of the comparing circuit CP1. Also the signal "d" produced by delaying the signal "c" by a predetermined time in the delay circuit DL2 is inputted into the other D type flip-flop of the comparing circuit CP2.

The comparing circuit CP1 produces an output pulse "e" when the phase of an input signal "b" for one D type flip-flop leads from the phase of the input signal "c" for the other D type flip-flop, and a pulse width of this output pulse "e" corresponds to the phase lead in duration. The comparing circuit CP1 produces another output pulse "f" when the phase of the signal "b" for one D type flip-flop lags the phase of the signal "c" for the other D type flip-flop, and a pulse width of this output pulse "f" corresponds to the phase lag in duration.

The comparing circuit CP2 produces an output pulse "g" when the phase of the input signal "a" for one D type flip-flop leads from the phase of the input signal "d" for the other D type flip-flop, and a pulse width of this output pulse "e" corresponds to this preceding duration. The comparing circuit CP1 produces another output pulse "f" when the phase of the signal "a" for one D type flip-flop lags the phase of the signal "d" for the other D type flip-flop, and a pulse width of this output pulse "f" corresponds to the phase lag in duration.

One output pulse "e" of the comparing circuit CP1 is combined with one output pulse "g" of the comparing circuit CP2 by the OR gate G1, and after the combined pulse "i" has been delayed by a predetermined time in the delay circuit DL3, the delayed pulse is inputted into the inverter. The output signal from the inverter is sent as the up signal "k" from the output terminal PUN to the charge pump. The other output pulse "f" of the comparing circuit CP1 is combined with the other output pulse "h" of the comparing circuit CP2 in the OR gate G2, and then the combined pulse is supplied as the down signal "j" from the output terminal PD to the charge pump. As indicated in FIG. 2, since the up signal "k" is delayed from the down signal "j" for a predetermined time by the delay circuit DL3, the pulse of the up signal "k" is not temporally overlapped with the pulse of the down signal "j". As a consequence, it is possible to prevent the up control functions and the down control in the charge pump from being carried out at the same time.

Figure 3:
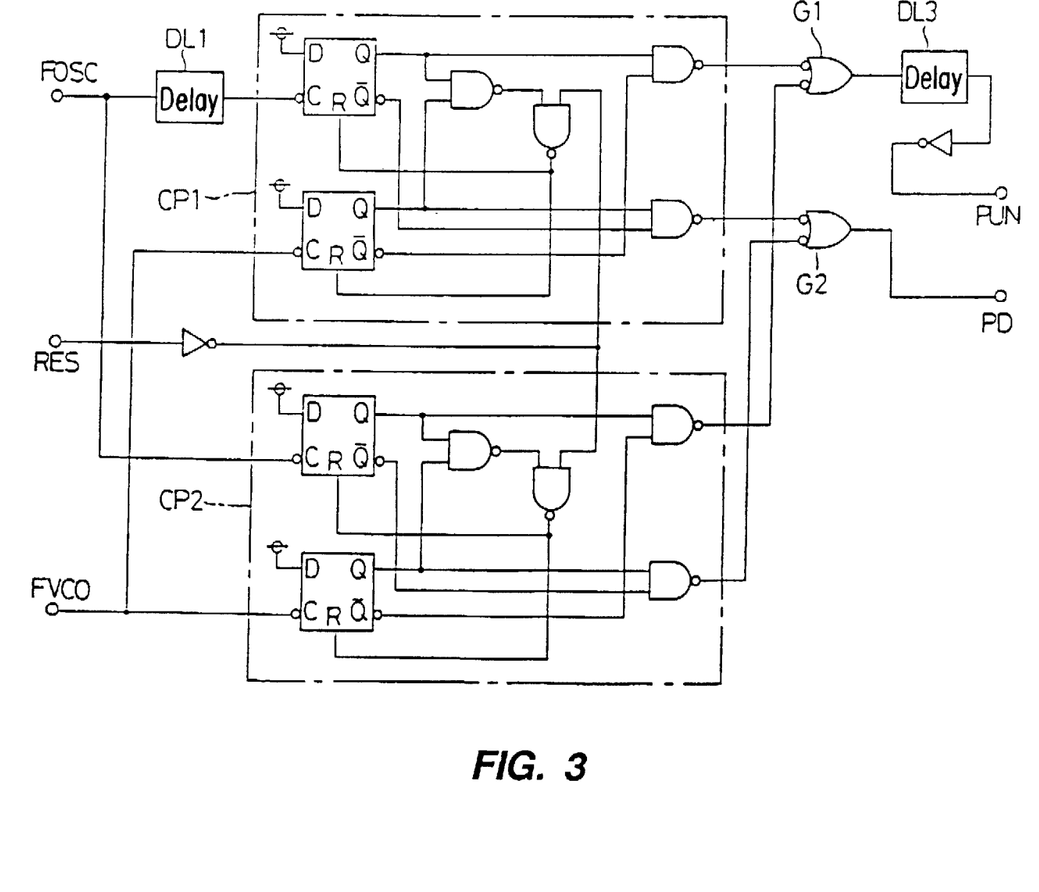
FIG. 3 is an electric circuit schematic of a phase comparator according to a second embodiment of the present invention.

FIG. 3 is an electric circuit schematic of a phase comparator according to a second embodiment of the present invention. In the phase comparator shown in FIG. 3, the delay circuit DL2 is omitted from the phase comparator shown in FIG. 1, and the input terminal FVCO is directly connected to the input of the D type flip-flop of the comparing circuit CP2. Other circuit arrangements of this phase comparator are essentially similar to those of the phase comparator indicated in FIG. 1. Since operations of this phase comparator may be readily conceived from the operations of the phase comparator indicated in FIG. 1, explanations thereof are omitted. In the phase comparator shown in FIG. 3, although the delay circuit DL2 is omitted with respect to the phase comparator shown in FIG. 1, since the delay circuit DL1 is provided similar to the phase comparator indicated in FIG. 1, a similar effect to that of the phase comparator shown in FIG. 1 can be obtained.

Figure 4:
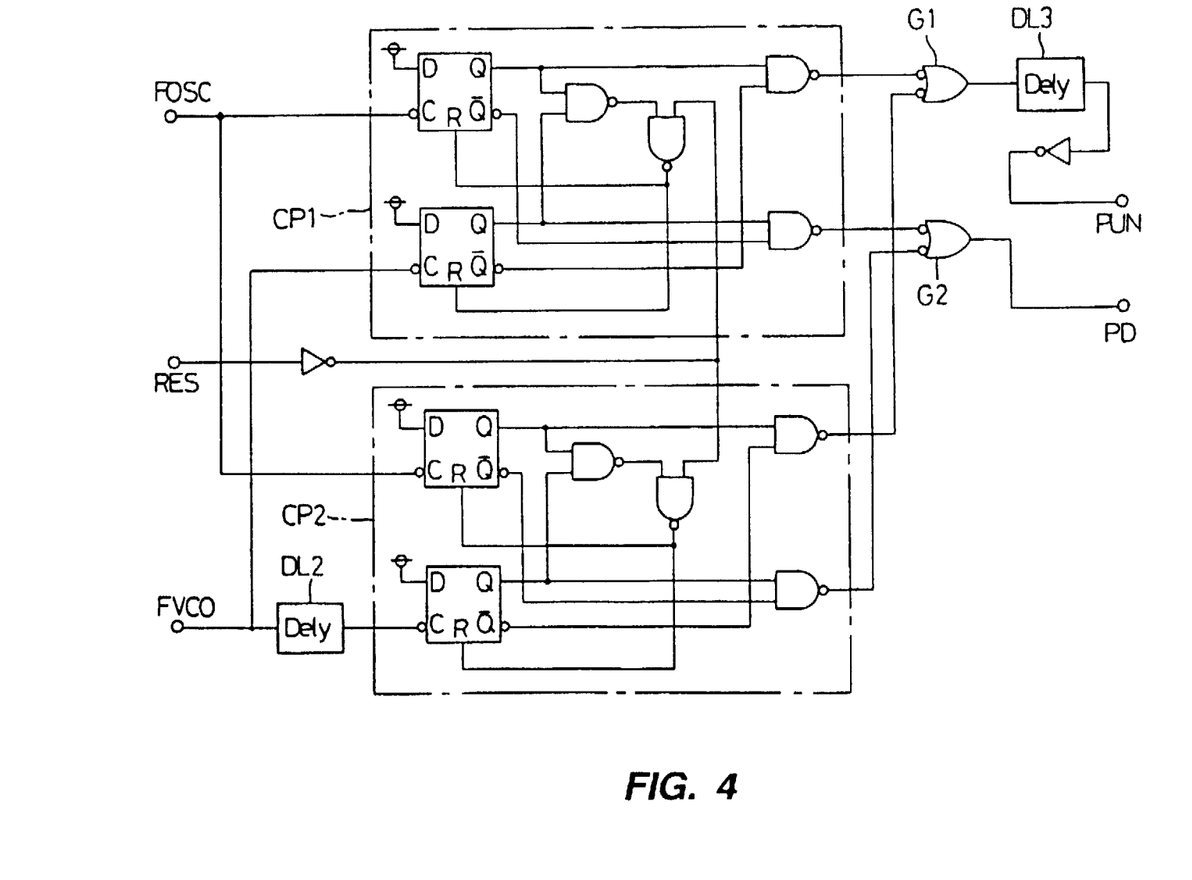
FIG. 4 is an electric circuit schematic of a phase comparator according to a third embodiment of the present invention.

FIG. 4 is an electric circuit diagram of a phase comparator according to a third embodiment of the present invention. In the phase comparator shown in FIG. 4, the delay circuit DL1 is omitted from the phase comparator shown in FIG. 1, and the input terminal FOSC is directly connected to the input of the D type flip-flop of the comparing circuit CP1. Other circuit arrangements of this phase comparator are essentially similar to those of the phase comparator indicated in FIG. 1. Since operations of this phase comparator may be readily conceived from the operations of the phase comparator indicated in FIG. 1, explanations thereof are omitted. In the phase comparator shown in FIG. 4, although the delay circuit DL1 is omitted with respect to the phase comparator shown in FIG. 1, since the delay circuit DL2 is provided similar to the phase comparator indicated in FIG. 1, a similar effect to that of the phase comparator shown in FIG. 1 can be obtained.

It should also be noted that although the output of the OR gate G1 is connected to the delay circuit DL3 in the first, second and third embodiments, the delay circuit DL3 may be connected to the output of the OR gate G2 without connecting the delay circuit DL3 to the outout of the OR gate G1. Also, in this case, it is possible to prevent the up control functions and the down control in the charge pump from being carried out at the same time.

The present invention makes it possible to obtain the phase comparator in which no insensible range is present even when the phases of the input signals are nearly equal to each other. Furthermore, optional use of the third delay circuit prevents the outputs derived from the first combining circuit and the second combining circuit from producing pulse overlapping during operation.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A phase comparator comprising:

a first delay circuit for delaying a first input signal;

a second delay circuit for delaying a second input signal;

a first comparing circuit for producing a first output pulse when a phase of said delayed first input signal leads a phase of said second input signal, said first output pulse corresponding in duration to a duration of said phase of said delayed first input signal leading said phase of said second input signal, and for producing a second output pulse when the phase of said delayed first input signal lags the phase of said second input signal, said second output pulse corresponding in duration to a duration of the phase of said delayed first input signal lagging said phase of said second input signal;

a second comparing circuit for producing a third output pulse when a phase of said first input signal leads a phase of said delayed second input signal, said third output pulse corresponding in duration to a duration of said phase of said first input signal leading said phase of said delayed second input signal, and for producing a fourth output pulse when the phase of said first input signal lags the phase of said delayed second input signal, said fourth output pulse corresponding in duration to a duration of said phase of said first input signal lagging said phase of said delayed second input signal;

a first combining circuit for combining said first output pulse with said third output pulse; and a second combining circuit for combining said second output pulse with said fourth output pulse.

2. A phase comparator as claimed in claim 1, further comprising a third delay circuit for relatively delaying an output of one of said first combining circuit and said second combining circuit with respect to another one of said first combining circuit and said second combining circuit.

3. A phase comparator for comparing a first input signal with a second input signal comprising:

a delay circuit for delaying said first input signal;

a first comparing circuit for producing a first output pulse when a phase of said delayed first input signal leads a phase of said second input signal, said first output pulse corresponding in duration to a duration of said phase of said delayed first input signal leading said phase of said second input signal, and for producing a second output pulse when the phase of said delayed first input signal lags the phase of said second input signal, said second output pulse corresponding in duration to a duration of the phase of said delayed first input signal lagging said phase of said second input signal;

a second comparing circuit for producing a third output pulse when a phase of said first input signal leads said phase of said second input signal, said third output pulse corresponding in duration to a duration of said phase of said first input signal leading said phase of said second input signal, and for producing a fourth output pulse when the phase of said first input signal lags the phase of said second input signal, said fourth output pulse corresponding in duration to a duration of said phase of said first input signal lagging said phase of said second input signal;

a first combining circuit for combining said first output pulse with said third output pulse; and a second combining circuit for combining said second output pulse with said fourth output pulse.

4. A phase comparator as claimed in claim 3, further comprising a second delay circuit for relatively delaying an output of one of said first combining circuit and said second combining circuit with respect to another one of said first combining circuit and said second combining circuit.

5. A phase comparator for comparing a first input signal with a second input signal comprising:

a delay circuit for delaying said second input signal;

a first comparing circuit for producing a first output pulse when a phase of said first input signal leads a phase of said second input signal, said first output pulse corresponding in duration to a duration of said phase of said first input signal leading said phase of said second input signal, and for producing a second output pulse when the phase of said first input signal lags the phase of said second input signal, said second output pulse corresponding in duration to a duration of the phase of said first input signal lagging said phase of said second input signal;

a second comparing circuit for producing a third output pulse when said phase of said first input signal leads a phase of said delayed second input signal, said third output pulse corresponding in duration to a duration of said phase of said first input signal leading said phase of said delayed second input signal, and for producing a fourth output pulse when the phase of said first input signal lags the phase of said delayed second input signal, said fourth output pulse corresponding in duration to a duration of said phase of said first input signal lagging said phase of said delayed second input signal;

a first combining circuit for combining said first output pulse with said third output pulse; and a second combining circuit for combining said second output pulse with said fourth output pulse.

6. A phase comparator as claimed in claim 5, further comprising a second delay circuit for relatively delaying an output of one of said first combining circuit and said second combining circuit with respect to another one of said first combining circuit and said second combining circuit.

7. A phase comparator as claimed in any one of claims 1 to 6, wherein each of said first combining circuit and said second combining circuit include an OR gate circuit.

8. A phase comparator apparatus for comparing the phase of first and second input signals, comprising:

first and second phase comparators each including:

a first and a second input;

first means for producing a first output signal proportional to a phase lead of a signal applied to said first input with respect to a signal applied to said second input; and second means for producing a second output signal proportional to a phase lag of said signal applied to said first input with respect to said signal applied to said second input;

means for applying said first input signal to one of said first input and said second input of said first phase comparator and delaying said first input signal and applying said delayed first input signal to said one of said first input and said second input of said second phase comparator;

means for applying said second input signal to another one of said first input and said second input of both said first phase comparator and said second phase comparator;

first means for combining said first output signals of said first and said second comparators and producing a first combined output signal; and second means for combining said second output signals of said first and said second comparators and producing a second combined output signal.

9. A phase comparator apparatus for comparing the phase of first and second input signals, comprising:

first and second phase comparators each including:
 a first and a second input;
 first means for producing a first output signal proportional to a phase lead of a signal applied to said first input with respect to a signal applied to said second input; and
 second means for producing a second output signal proportional to a phase lag of said signal applied to said first input with respect to said signal applied to said second input;

means for applying said first input signal to one of said first input and said second input of said first phase comparator and delaying said first input signal and applying said delayed first input signal to said one of said first input and said second input of said second phase comparator;

means for applying said second input signal to another one of said first input and said second input of said second phase comparator and delaying said second input signal and applying said delayed second input signal to said another one of said first input and said second input of said first phase comparator;

first means for combining said first output signals of said first and said second comparators and producing a first combined output signal; and second means for combining said second output signals of said first and said second comparators and producing a second combined output signal.

10. The phase comparator apparatus of one of claims 8 or 9 wherein said first and second means for combining are OR gates.

11. The phase comparator apparatus of one of claims 8 to 10 further comprising means for delaying one of said first and said second combined output signals.

* * * * *